(12) United States Patent
Weber et al.

(10) Patent No.: US 7,705,413 B2
(45) Date of Patent: Apr. 27, 2010

(54) MICROMECHANICAL COMPONENT AND METHOD FOR PRODUCING A MICROMECHANICAL COMPONENT

(75) Inventors: Heribert Weber, Nuertingen (DE); Ralf Hausner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/221,368

(22) Filed: Aug. 1, 2008

(65) Prior Publication Data
US 2009/0079037 A1   Mar. 26, 2009

(30) Foreign Application Priority Data
Sep. 20, 2007   (DE) ...................... 10 2007 044 806

(51) Int. Cl.
*H01L 29/84* (2006.01)
(52) U.S. Cl. ...................... 257/418; 257/419; 257/420; 257/E29.324
(58) Field of Classification Search .................. 257/418, 257/419, 420, E29.324
See application file for complete search history.

(56) References Cited

U.S. PATENT DOCUMENTS

| | | | | |
|---|---|---|---|---|
| 4,869,282 A * | 9/1989 | Sittler et al. | ............. | 137/15.01 |
| 5,221,400 A * | 6/1993 | Staller et al. | ................. | 156/292 |
| 6,265,246 B1 * | 7/2001 | Ruby et al. | .................. | 438/113 |
| 6,801,679 B2 * | 10/2004 | Koh et al. | ...................... | 385/14 |
| 7,013,734 B2 * | 3/2006 | Zdeblick et al. | ............... | 73/715 |
| 7,066,031 B2 * | 6/2006 | Zdeblick et al. | ............... | 73/715 |
| 7,073,387 B2 * | 7/2006 | Zdeblick et al. | ............... | 73/715 |
| 7,075,701 B2 * | 7/2006 | Novotny et al. | ............. | 359/291 |
| 7,085,445 B2 * | 8/2006 | Koh et al. | ...................... | 385/22 |
| 7,394,138 B2 * | 7/2008 | Katou et al. | ................. | 257/414 |
| 7,398,688 B2 * | 7/2008 | Zdeblick et al. | ............... | 73/700 |
| 7,579,663 B2 * | 8/2009 | Wan | ........................... | 257/415 |
| 2001/0001550 A1 * | 5/2001 | Bryzek et al. | ................. | 338/36 |
| 2002/0167730 A1 * | 11/2002 | Needham et al. | ............ | 359/578 |
| 2003/0113067 A1 * | 6/2003 | Koh et al. | ...................... | 385/48 |
| 2003/0217915 A1 * | 11/2003 | Ouellet et al. | .......... | 204/192.15 |
| 2004/0065932 A1 * | 4/2004 | Reichenbach et al. | ....... | 257/415 |
| 2004/0195638 A1 * | 10/2004 | Fischer et al. | ............... | 257/417 |
| 2004/0245586 A1 * | 12/2004 | Partridge et al. | ............ | 257/414 |
| 2005/0062120 A1 * | 3/2005 | Ma et al. | ..................... | 257/414 |
| 2005/0142685 A1 * | 6/2005 | Ouellet et al. | ................. | 438/51 |
| 2005/0160823 A1 * | 7/2005 | Zdeblick et al. | ............... | 73/715 |
| 2005/0160824 A1 * | 7/2005 | Zdeblick et al. | ............... | 73/715 |
| 2005/0160825 A1 * | 7/2005 | Zdeblick et al. | ............... | 73/715 |
| 2005/0160826 A1 * | 7/2005 | Zdeblick et al. | ............... | 73/715 |

(Continued)

FOREIGN PATENT DOCUMENTS

DE   100 37 821   2/2002

(Continued)

*Primary Examiner*—Ngan Ngo
(74) *Attorney, Agent, or Firm*—Kenyon & Kenyon LLP

(57) ABSTRACT

A micromechanical component, in particular a micromechanical sensor, having a first wafer and a second wafer is provided, the first wafer having at least one structural element, and the second wafer having at least one mating structural element, and, in addition, the structural element and the mating structural element are designed in such a way that a relative displacement of the first wafer relative to the second wafer parallel to a main extension plane of the first wafer essentially leads to compressive loading or tensile loading between the structural element and the mating structural element.

10 Claims, 5 Drawing Sheets

U.S. PATENT DOCUMENTS

| | | | |
|---|---|---|---|
| 2005/0160827 A1* | 7/2005 | Zdeblick et al. | 73/715 |
| 2005/0205951 A1* | 9/2005 | Eskridge | 257/416 |
| 2005/0279090 A1* | 12/2005 | Silverbrook | 60/527 |
| 2006/0055001 A1* | 3/2006 | Fujii | 257/619 |
| 2006/0067651 A1* | 3/2006 | Chui | 385/147 |
| 2006/0077531 A1* | 4/2006 | Novotny et al. | 359/291 |
| 2006/0131731 A1* | 6/2006 | Sato | 257/704 |
| 2006/0208326 A1* | 9/2006 | Nasiri et al. | 257/414 |
| 2007/0170530 A1* | 7/2007 | Partridge et al. | 257/415 |
| 2007/0279638 A1* | 12/2007 | Choo et al. | 356/511 |
| 2009/0152656 A1* | 6/2009 | Okudo et al. | 257/419 |
| 2009/0160040 A1* | 6/2009 | Nabki et al. | 257/678 |

FOREIGN PATENT DOCUMENTS

WO    WO 2007/061059    5/2007

* cited by examiner a)

b)

c)

d)

e)

MICROMECHANICAL COMPONENT AND METHOD FOR PRODUCING A MICROMECHANICAL COMPONENT

RELATED APPLICATION INFORMATION

The present application claims priority to and the benefit of German patent application no. 10 2007 044 806.8, which was filed in Germany on Sep. 20, 2007, the disclosure of which is incorporated herein by reference.

FIELD OF THE INVENTION

The present invention is based on a micromechanical component.

BACKGROUND INFORMATION

Such a micromechanical component is generally known. The printed publication DE 100 37 821 A1, for example, discusses a micromechanical component which has two functional layers lying diametrically opposed, the functional layers being operatively connected via a connecting center layer, and the functional layers additionally having a depression in the region of the operative connection. Relative displacements that occur between the functional layers parallel to their main extension plane are prevented solely by the operative connection. However, especially in the encapsulation of micromechanical components, relatively high pressures and forces arise, which subject the layers to high compressive loading and shear forces. In the extreme case, this results in tears in the operative connections, losses in the adhesion between the layers, permeability of the functional region, and/or malfunction of the micromechanical component. A mechanically stable contact for the absorption of such forces is not provided in the related art.

SUMMARY OF THE INVENTION

In contrast to the related art, the micromechanical component according to the present invention and the method for producing the micromechanical component have the advantage of achieving a much stronger mechanical connection between the first and the second wafer, especially with regard to shear forces between the cap wafer and the functional layer. The structural component and the mating structural component are formed such that a relative displacement of the first wafer with respect to the second wafer in the main extension plane essentially leads to compressive or tensile loading between the structural component and the mating structural component. The compensation of shear forces between the wafers with the aid of structural and mating structural components, which absorb the shear forces as compressive loads and compensate them, naturally have much higher stability and load capacity than the integral connections for the absorption of shear forces disclosed in the related art.

Furthermore, such structures can be produced in a relatively simple and thus cost-effective manner utilizing a known way. In contrast to the related art, an additional method step for producing an integral connection between the wafers is unnecessary. The structural elements and mating structural elements may be arranged in such a way that a frictional connection and/or form-locking connection is produced between the structural and the mating structural elements or the first and second wafer, for example by mutual compression of the structural elements with the mating structural elements or the first and second wafer, respectively. In an exemplary manner, the micromechanical component includes a micromechanical sensor.

The further measures specified herein make possible advantageous further refinements and improvements of the micromechanical component described herein.

According to one exemplary embodiment of the micromechanical component according to the present invention, the first wafer has an additional structural element, and the second wafer has an additional mating structural element, which are designed such that a relative displacement of the first wafer with respect to the second wafer perpendicular to the main extension plane essentially results in additional compressive loading or tensile loading between the further structural element and the further mating structural element. Relative displacements between the first and the second wafer as a result of compressive and/or tensile loading running perpendicular to the main extension plane are thus compensated in an especially advantageous manner as well. It is particularly advantageous that force components in random directions acting between the first and the second wafer are thus able to be transformed into compressive and/or tensile loads, so that relatively large forces are able to be absorbed or compensated. Therefore, in comparison with the related art, the micromechanical component has much greater stability with respect to external compressive and lateral forces from random directions.

According to another exemplary embodiment of the micromechanical component according to the present invention, the first and/or the second wafer have/has a functional region, which is surrounded by a sealing region, the functional region may be completely surrounded by the sealing region in the main extension plane. Furthermore, via a planar contact between the first and the second wafer, the circumferential sealing region also allows complete sealing of the atmosphere, in particular an overpressure or underpressure, in the functional region between the structural element and the mating structural element, and/or between the additional structural element and the additional mating structural element, especially via a joining medium. The second wafer and the first wafer may be set apart from one another in such a way that a direct mechanical contact between the first and the second wafer is provided only in a region of compressive or tensile loading and/or in the sealing region and via the joining medium, in particular. This advantageously enables optimal compressing of the joining medium in the area of compressive or tensile loading, and/or any particles between the first and the second wafer do not have an adverse effect on the relative position and alignment of the wafer with respect to each other and on the bonding quality. Therefore, the manufacturing tolerances are considerably increased in an especially advantageous manner. In an exemplary manner, a buried conductor track structure is provided for the electrical contacting of the functional region.

According to another exemplary embodiment of the micromechanical component of the present invention, a joining medium, in particular a Sealglas, is introduced into the sealing region and/or into at least one subregion of at least one structural and/or mating structural element, the joining medium being provided to seal the functional region and, in particular, to create a mechanically stable connection between the first and the second wafer. Sealing of the atmosphere of the functional region is made possible in an advantageous and simple manner by introducing the joining medium into the sealing region. A mechanically stable connection, in particular an adhesive bond, is ensured between the first and the second wafer by disposing the joining medium partially in the region of compressive and tensile loading, on a structural element, on a further structural element, on a mating structural element, and/or on a further mating structural element; at the same time, direct compressive loading between the structural, the additional structural, the mating structural and/or the further mating structural elements is provided, which may be via the Sealglas.

According to a further exemplary embodiment of the micromechanical component of the present invention, the structural element and/or the further structural element are/is at least partially realized in the form of a groove, and the mating structural element and/or the further mating structural element are/is at least partially realized in the form of a stud structure, which is designed to at least partially engage with the groove, the groove and/or the stud structure in particular completely surrounding the functional region in the main extension plane. In an advantageous manner, the region of compressive or tensile loading and the sealing region are made possible by a shared groove and stud structure of the first and the second wafer, a groove and stud structure completely surrounding the functional region bringing about a mechanical fixation of the wafer that is able to withstand maximum loading with respect to relative shear forces between the wafers.

Due to an exemplary introduction of the joining medium between the groove surface and the surface of the stud structure, the joining medium simultaneously acts as sealer and as a way for producing a mechanically stable connection, in particular an adhesive bond, between the first and the second wafer. In an especially exemplary manner, at least one additional mechanical contact is provided between the first and the second wafer outside the groove and stud structure.

According to another exemplary embodiment of the micromechanical component of the present invention, the functional region has at least one displaceable element, the displaceable element being displaceable relative to the first and/or the second wafer, and the first and/or the second wafer have/has a limit stop, which functions as mechanical delimitation of a maximum deflection of the displaceable structure perpendicular to the first main extension plane. In an advantageous manner, the maximum deflection of the displaceable structure is clearly definable by the limit stop, so that damage to the displaceable structure due to overstretching or overloading in an excessive deflection of the displaceable structure is prevented.

According to another exemplary embodiment of the micromechanical component of the present invention, the first wafer includes a functional layer, and the second layer includes a cap wafer, or the first wafer includes a cap wafer, and the second wafer includes a functional layer, which may be of a semiconductor material, which may be of silicon. As a result, the encapsulation of conventional functional layers of micromechanical components providing the aforementioned advantages is made possible in comparison with the related art.

An additional subject matter of the present invention is a method for producing a micromechanical component, in which a first protective layer is applied on a cap wafer and patterned in a first method step, the cap wafer is etched in a third method step, and the first protective layer is at least partially removed in a fourth method step, the cap wafer is etched once again in a fifth method step, and in a ninth method step the cap wafer is connected to a functional layer in such a way that the stud structure engages with the groove of the functional layer and a stable mechanical connection is produced in at least one subregion of the groove surface. In an advantageous manner, a mechanical connection that is considerably more stable than in the related art, especially with regard to shear forces, is provided between the cap wafer and the functional layer, and atmospheric sealing of the functional layer takes place simultaneously. In particular, a stud-groove structure is provided, the stud locking into place in the groove.

According to another exemplary embodiment, a masking layer and/or a second protective layer are/is deposited on the cap waver and patterned in a second method step following the first method step, the masking layer and/or the second protective layer being removed in a sixth method step, and another etching operation of the cap wafer is carried out in a seventh method step to form the stud structure, and the first protective layer is optionally removed in an eighth method step prior to the ninth step. A stop of the cap wafer is advantageously produced in an uncomplicated manner, so that direct contact is possible between the functional layer and the cap wafer. In this way, in particular the stop structures above the displaceable structures are able to be positioned in the cap wafer at a precisely defined distance to the displaceable structures.

According to a exemplary embodiment of the micromechanical component according to the present invention, a tenth method step is inserted between the eighth and ninth method steps, and a joining medium is applied on the stud structure. The joining medium advantageously adapts to the gap between the groove and stud structure and thereby leads to a mechanically stable connection between cap wafer and functional layer.

According to another exemplary embodiment of the micromechanical component, the tenth method step includes the application of a glass, especially Sealglas, as joining medium, the glass being applied in a screen-printing process and glazed in a prebake operation. A method for joining the cap wafer and the functional layer is advantageously realized in an uncomplicated manner with the aid of a joining medium.

According to another exemplary embodiment of the micromechanical component according to the present invention, it is provided that a partial method step is inserted in the first method step between the application and the patterning of the first protective layer on the cap wafer, in which a third protective layer, for instance an aluminum layer, is applied and patterned, and an eleventh method step is inserted between the fifth and the sixth method step in order to remove the third protective layer. This advantageously results in an additional mechanical contact region in the cap wafer, which allows bracing of the cap wafer by the functional layer in the finished micromechanical component. Because of the application and the patterning of the third protective layer, the bracing is dimensioned in a simple manner and adapted to the corresponding contact structure in the functional layer.

According to another exemplary embodiment of the micromechanical component according to the present invention, a twelfth and a thirteenth method step are inserted between the seventh and the eighth method step or between the eighth and the ninth method step; in the twelfth method step, the cap wafer is provided with a fourth protective layer on a first surface and a second surface, the surfaces each having an additional main extension plane parallel to the first main extension plane, and through-etchings are etched and/or trenched in the cap wafer in the thirteenth method step, the etching process being implemented in particular from a first direction lying perpendicular to the first main extension plane, and/or from a second direction lying anti-parallel to the first direction, and the extension of the through-etchings parallel to the first direction is identical to the extension of the cap wafer parallel to the first direction. The etching of the cap wafer advantageously allows an electrical contacting of the functional layer, in particular of bond pads on the functional layer.

Exemplary embodiments of the present invention are depicted in the drawing and described in greater detail in the description below.

DETAILED DESCRIPTION

Figure 1:
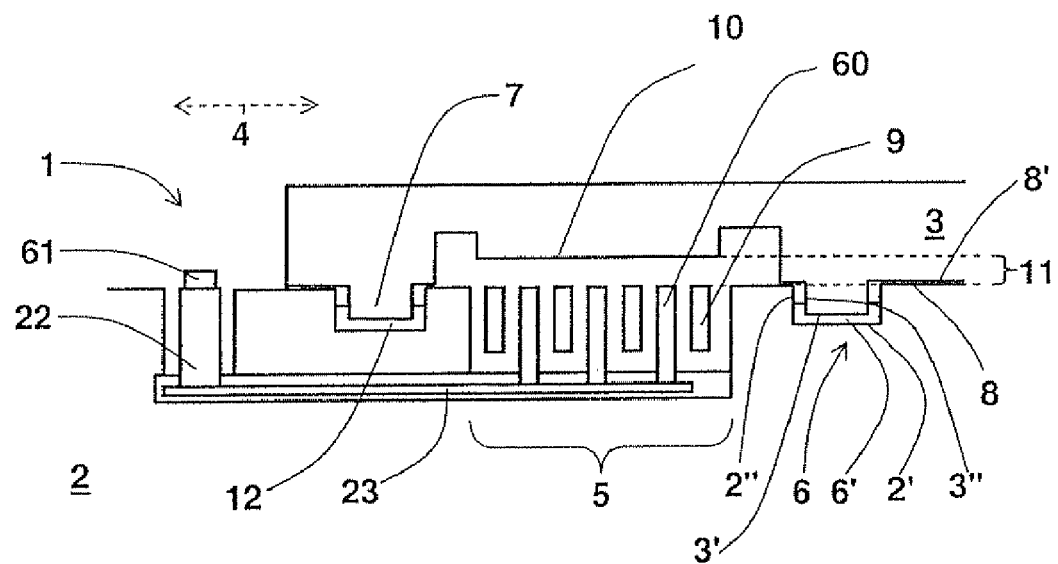
FIG. 1 shows a first specific embodiment of the micromechanical component according to the present invention in a first schematic side view.

In the various figures identical components have always been provided with the same reference numerals and thus are usually also numbered only once.

FIG. 1 shows a schematic side view of a first exemplary specific embodiment of micromechanical component 1 according to the present invention; micromechanical component 1 has a functional layer 2 and a cap wafer 3, cap wafer 3 being in parallel alignment with a first main extension plane 4 of functional layer 2, and functional layer 2 having a functional region 5; functional region 5 is at least partially surrounded by a groove 6 in functional layer 2, groove 6 being situated perpendicular to first main extension plane 4; in addition, cap wafer 3 has a stud structure 7 perpendicular to main extension plane 4, which engages with groove 6 and is mechanically fixedly connected to the groove surface in at least one subregion. Stud structure 7 and groove 6 include structural element 2" and additional structural element 2', as well as mating structural element 3" and additional mating structural element 3'.

The sealing and compressive or tensile load region 6' of groove-stud structure 6, 7 includes, in particular, a joining medium 12, which may be Sealglas, which fills the space between cap wafer 3 and functional layer 2 in the region of groove 6, and which establishes a stable mechanical and atmospherically sealed connection between cap wafer 3 and functional layer 2. Furthermore, cap wafer 3 and functional layer 2 may have direct contacts 8 in subregions. Functional region 5, in particular, includes non-displaceable and displaceable elements 60, 9, displaceable elements 9 being provided so as to be displaceable with respect to cap wafer 3 and/or functional layer 2, and cap wafer 3 having a stop 10, which functions as mechanical delimitation of a maximum deflection 11 of displaceable structure 9 perpendicular to first main extension plane 4.

Furthermore, micromechanical component 1 has a buried conductor track structure 23 to contact functional region 5, it particularly being the case that displaceable and/or non-displaceable elements 9, 60 are able to be electrically contacted by way of a conductor track 23 and a contact structure 22, via a contact 61 in the region of functional layer 2. Joining medium 12 may be disposed in the region of direct contacts 8, as well.

Figure 2:
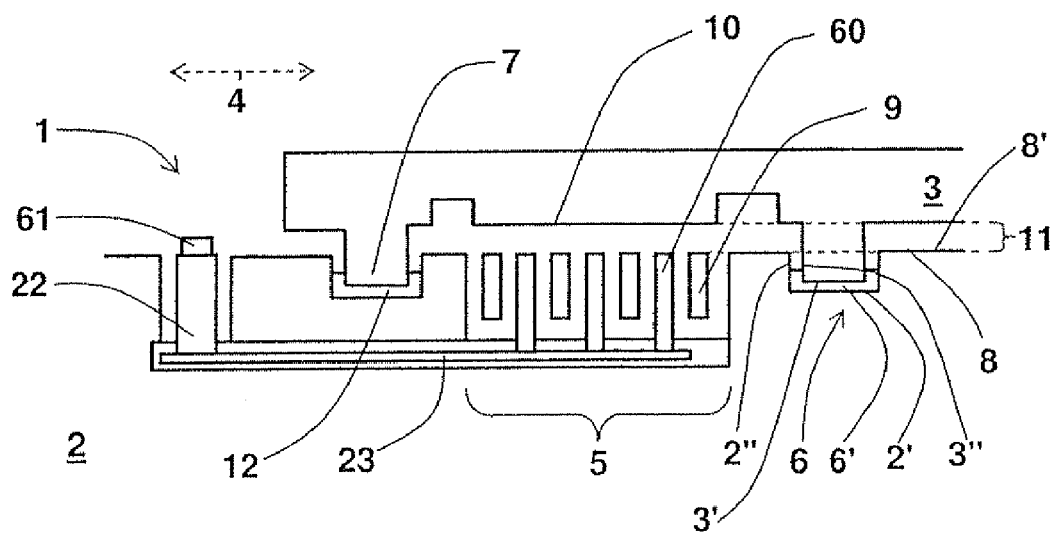
FIG. 2 shows a second specific embodiment of the micromechanical component according to the present invention in a first schematic side view.

FIG. 2 shows a schematic side view of a second exemplary specific embodiment of micromechanical component 1 according to the present invention, micromechanical component 1 essentially being identical to the micromechanical component of the first specific embodiment according to FIG. 1 with the exception that cap wafer 3 and functional layer 2 are distanced from another in such a way that a direct mechanical contact between cap wafer 3 and functional layer 2 is provided only in groove-stud structure 6, 7 and via joining medium 12, in particular.

Figure 3:
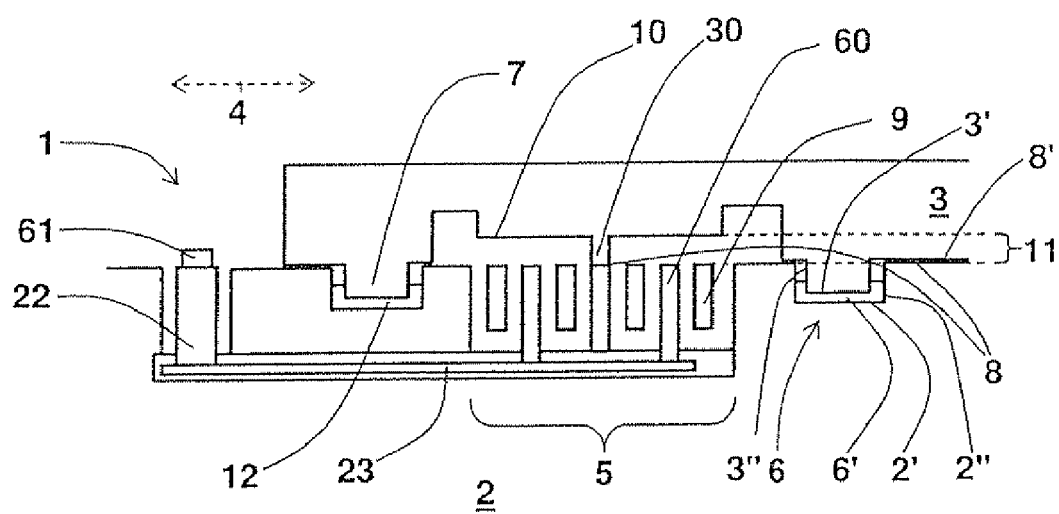
FIG. 3 shows a third specific embodiment of the micromechanical component according to the present invention in a first schematic side view.

FIG. 3 shows a schematic side view of a third exemplary specific embodiment of micromechanical component 1 according to the present invention, micromechanical component 1 essentially corresponding to the micromechanical component of a first specific embodiment according to FIG. 1, with the exception that cap wafer 3 additionally has a further mechanical contact 8 in functional region 5, which provides mechanical support for an additional further mating structural element 30 of cap wafer 3 and, in particular, prevents it from bending perpendicular to main extension direction 4.

FIGS. 4a to 4e show a schematic illustration of the various method steps for producing a micromechanical component of the present invention according to the first specific embodiment, with the aid of different precursor structures; in a first and second method step, illustrated with the aid of a first precursor structure in FIG. 3a, a first protective layer 20 and a second protective layer 21 are applied on a cap wafer 3 and patterned, cap wafer 3 is etched 40, and first protective layer 20 is at least partially removed in a third and fourth method step, shown in FIG. 3b with the aid of a second precursor structure, and cap wafer 3 is etched anew 41 in a fifth method step illustrated in FIG. 3c with the aid of a third precursor structure. A fourth precursor structure shown in FIG. 3d illustrates a sixth and seventh method step, second protective layer 21 being at least partially removed, and an additional etching process 42 of cap wafer 3 being implemented in order to form stud structure 7. An eighth, ninth, and tenth method step are shown with the aid of a fifth precursor structure in FIG. 3e, first protective layer 20 optionally being removed, and a joining medium 12, which may be Sealglas, being applied on stud structure 7; furthermore, cap wafer 3 is joined to a functional layer 2 in such a way that stud structure 7 engages with groove 6 of functional layer 2 and a fixed, mechanical connection is produced in at least one subregion of groove surface 6'.

Figures 4A, 4B, 4C, 4D, 4E:
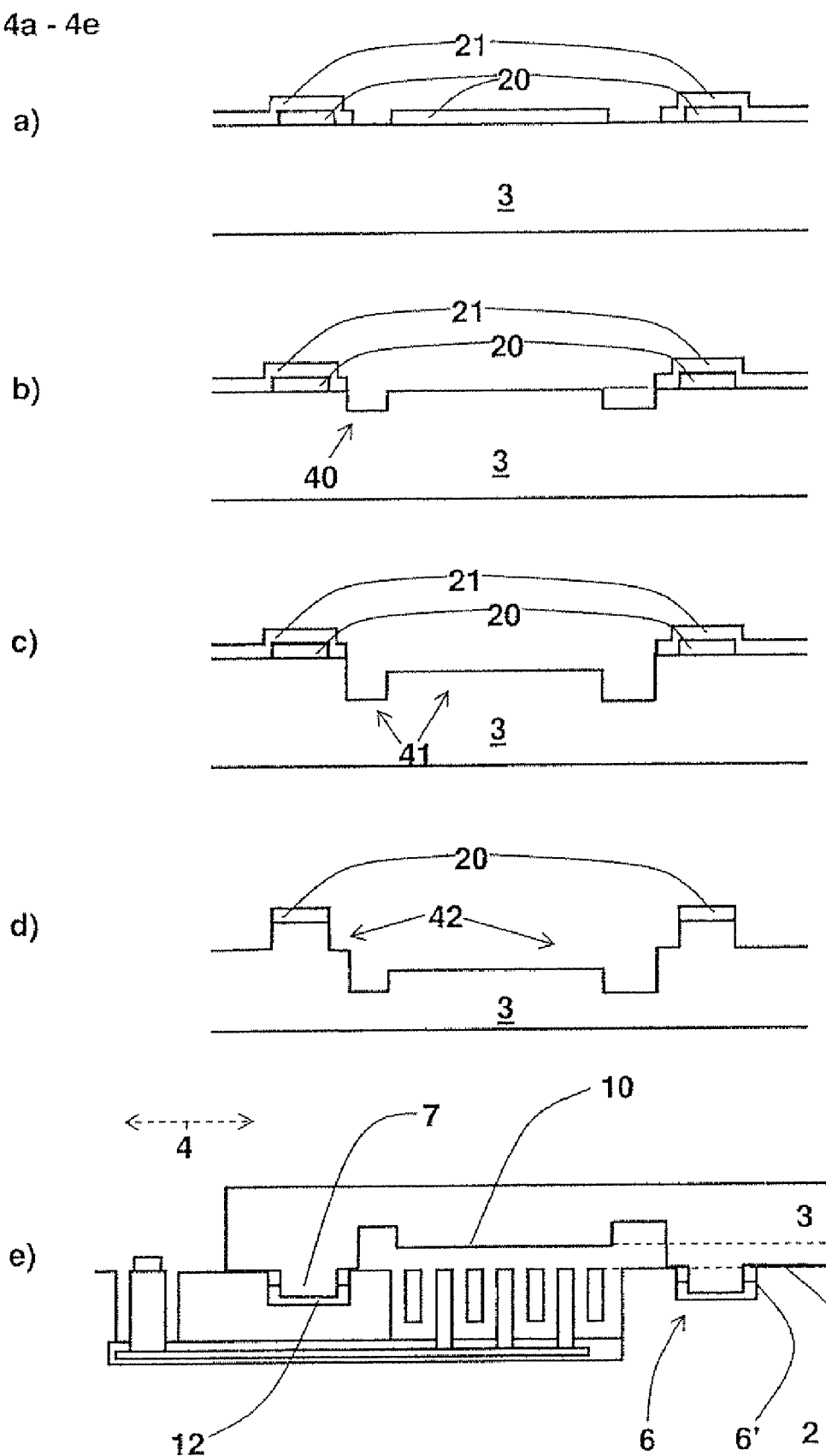
FIGS. 4a, 4b, 4c, 4d and 4e show a schematic illustration of the method steps for producing a micromechanical component of the present invention according to the first specific embodiment.

FIGS. 5a to 5e show a schematic illustration of the various method steps for producing a micromechanical component of the present invention according to the second specific embodiment with the aid of additional different precursor structures, the first and the second method steps and an additional partial method step being illustrated with the aid of a sixth precursor structure in FIG. 4a, the first, second, and a third protective layer 20, 21, 16, respectively, being applied on a cap wafer 3 and patterned. The third and fourth method steps are illustrated in FIG. 4b with the aid of a seventh precursor structure, and the fifth method step in FIG. 4c is illustrated with the aid of an eighth precursor structure. The ninth precursor structure in FIG. 4d illustrates an eleventh, the sixth, and the seventh method step; the third and the second protective layer 16, 21, as well as first protective layer 20 in region 30 of mechanical supports 3 are removed in functional region 5, and an additional etching process 42 of cap wafer 3 is implemented in order to form stud structure 7. The eighth, ninth, and tenth method steps are shown in FIG. 4e with the aid of a tenth precursor structure.

Figure 5A:
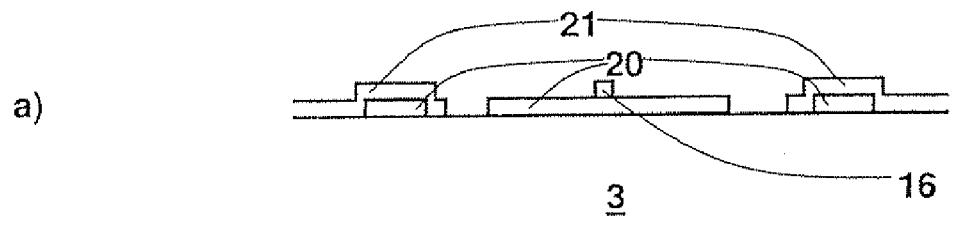
FIGS. 5a, 5b, 5c, 5d and 5e show a schematic illustration of the method steps for producing a micromechanical component of the present invention according to the third specific embodiment.
Figure 5B:
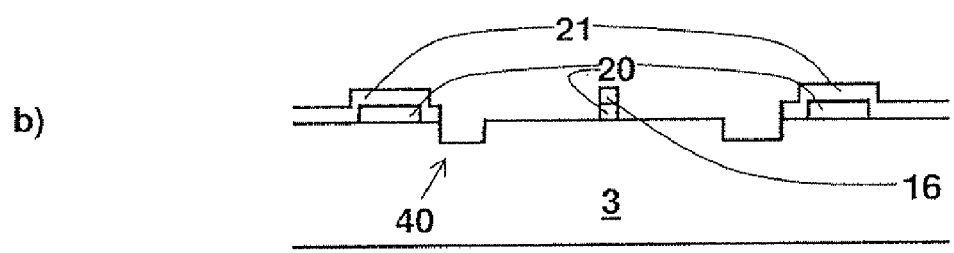
Figure 5C:
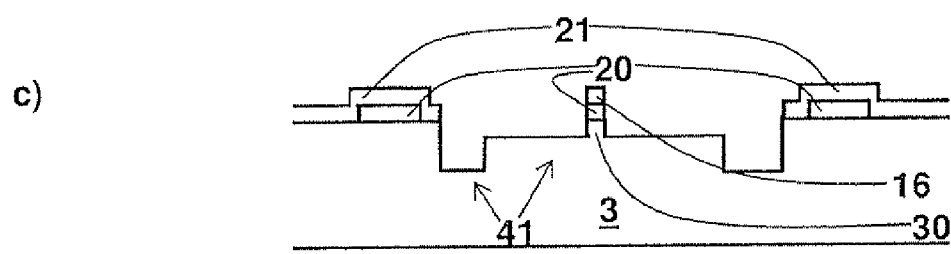
Figure 5D:
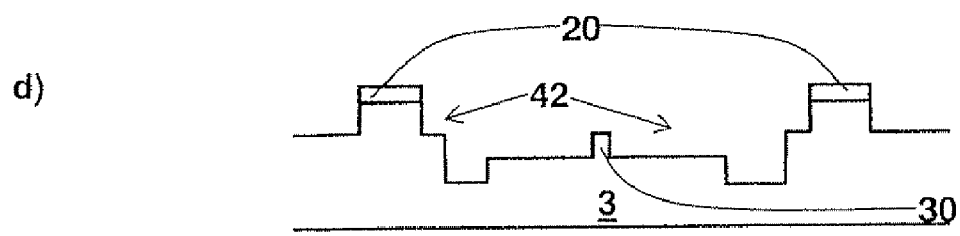
Figure 5E:
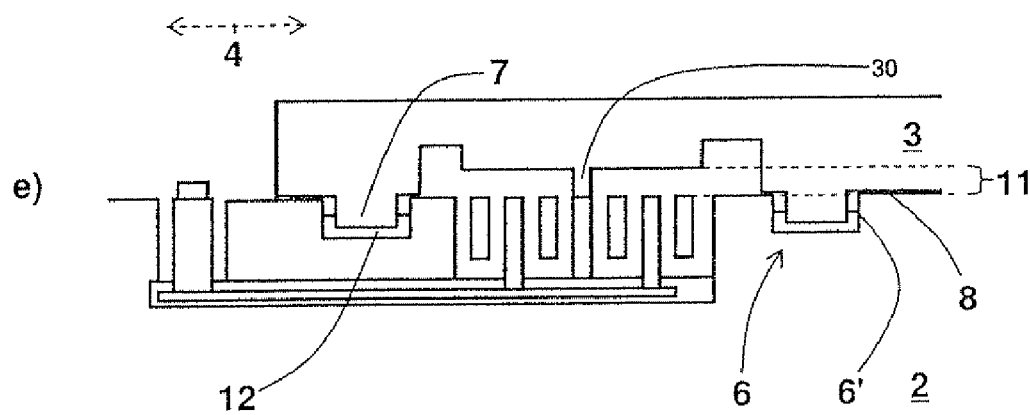
Figures 6A, 6B, 6C:
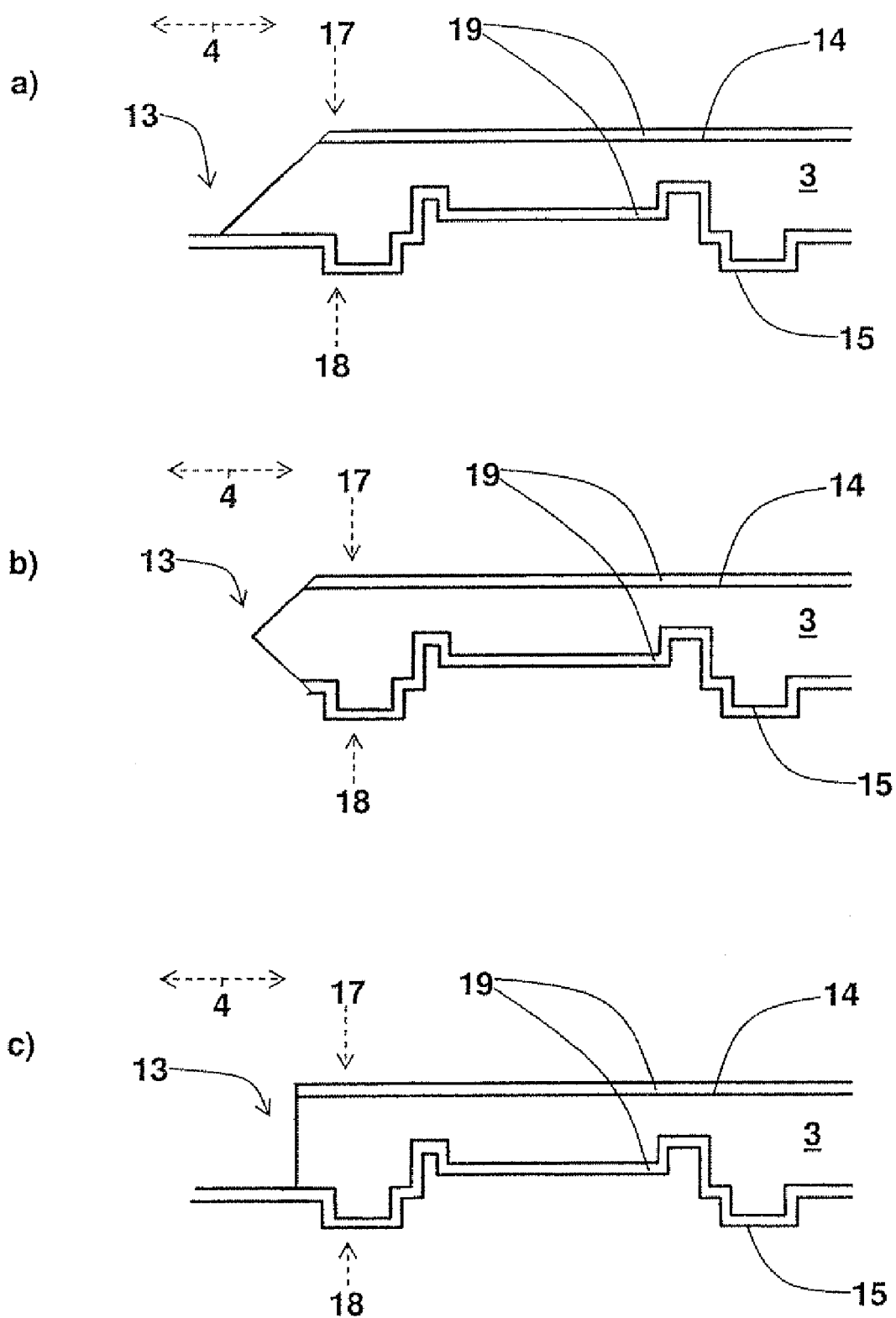
FIGS. 6a, 6b and 6c show schematic precursor structures of additional method steps for producing a micromechanical component of the present invention, according to additional specific embodiments.

FIGS. 6a to 6c show a schematic representation of additional method steps for producing a micromechanical component of the present invention according to additional specific embodiments with the aid of further different precursor structures, a twelfth and a thirteenth method step, each illustrated with the aid of an eleventh, twelfth, and thirteenth precursor structure in FIGS. 5a to 5c, being inserted between the seventh and the eighth or between the eighth and the ninth method step. The twelfth method step includes the application of a fourth protective layer 19 on the surfaces of cap wafer 3, the application may be provided on both sides 14, 15 on cap wafer 4 in a direction 17, 18 that is perpendicular to main extension plane 4 in each case. The thirteenth method step includes wet-chemical etching, e.g., using potassium hydroxide (KOH), and/or trenching 13 of cap wafer 3 in order to produce through-etchings 13 in cap wafer 3; a wet-chemical etching operation from one side 14 of cap wafer 3 from a direction 17 perpendicular to main extension plane 4 being shown with the aid of eleventh precursor structure in FIG. 5a, and a two-sided etching operation from both sides 14, 15 of cap wafer 3 from direction 17, 18 perpendicular to main extension plane 4 is shown with the aid of a twelfth precursor structure in FIG. 5b, and a trench operation of cap wafer 3 from a direction 17 perpendicular to main extension plane 4 is shown with the aid of a thirteenth precursor structure in FIG. 5c.

A production of the thirteenth precursor structure in FIG. 5c is especially provided in such a way that the etching time in the two-sided etching operation, using potassium hydroxide, for instance, of the twelfth precursor structure shown in FIG. 5b is selected of such length that a flank (110-plane) is formed perpendicular to main extension plane 4 between the two sides 14, 15.

What is claimed is:

1. A micromechanical component, which is a micromechanical sensor, comprises:
   a first wafer having at least one structural element; and
   a second wafer having at least one mating structural element;
   wherein the structural element and the mating structural element are configured so that a relative displacement of the first wafer with respect to the second wafer parallel to a main extension plane of the first wafer essentially leads to one of compressive loading and tensile loading between the structural element and the mating structural element, wherein at least one of the first wafer and the second wafer includes a functional region, which is surrounded by a sealing region, wherein the functional region has at least one displaceable element, the displaceable element being provided so as to be displaceable with respect to at least one of the first wafer and the second wafer, and at least one of the first wafer and the second wafer includes a stop, which functions as mechanical delimitation of a maximum deflection of the displaceable structure perpendicular to the first main extension plane.

2. The micromechanical component of claim 1, wherein the first wafer includes an additional structural element, and the second wafer includes an additional mating structural element, which are configured so that a relative displacement of the first wafer with respect to the second wafer perpendicular to the main extension plane essentially leads to one of compressive loading and tensile loading between the further structural element and the further mating structural element.

3. The micromechanical component of claim 1, wherein a joining medium is provided in at least one of the sealing region and in at least one subregion of at least one of at least one structural element and at least one mating structural element, the joining medium being provided to seal the functional region, and providing a mechanically stable connection between the first wafer and the second wafer.

4. The micromechanical component of claim 1, wherein at least one of the structural element and the additional structural element are configured at least partially as a groove, and at least one of the mating structural element and the additional mating structural element are at least partially configured as a stud structure, which is provided so as to at least partially engage with the groove, and wherein at least one of the groove and the stud structure completely surrounds the functional region in a main extension plane.

5. The micromechanical component of claim 1, wherein one of (i) the first wafer has a functional layer, and the second wafer has a cap wafer, and (ii) the first wafer has a cap wafer, and the second wafer has a functional layer.

6. The micromechanical component of claim 1, wherein at least one of the first wafer and the second wafer includes a functional region, which is surrounded by a sealing region, the functional region being completely surrounded by the sealing region in the main extension plane.

7. The micromechanical component of claim 1, wherein the joining medium is Sealglas.

8. The micromechanical component of claim 1, wherein one of (i) the first wafer has a functional layer, and the second wafer has a cap wafer, and (ii) the first wafer has a cap wafer, and the second wafer has a functional layer, which is of a semiconductor material.

9. The micromechanical component of claim 1, wherein one of (i) the first wafer has a functional layer, and the second wafer has a cap wafer, and (ii) the first wafer has a cap wafer, and the second wafer has a functional layer, which is of a semiconductor material of silicon.

10. The micromechanical component of claim 1, wherein the at least one displaceable element is electrically contacted to a buried conductor track structure.

* * * * *